United States Patent
Lin

(10) Patent No.: US 9,490,022 B2
(45) Date of Patent: Nov. 8, 2016

(54) DATA STORAGE DEVICE AND DATA MAINTENANCE METHOD

(71) Applicant: Silicon Motion, Inc., Jhubei (TW)

(72) Inventor: Wen-Sheng Lin, Kaohsiung (TW)

(73) Assignee: Silicon Motion, Inc., Jhubei (TW)

( * ) Notice: Subject to any disclaimer, the term of this patent is extended or adjusted under 35 U.S.C. 154(b) by 0 days.

(21) Appl. No.: 15/009,400

(22) Filed: Jan. 28, 2016

(65) Prior Publication Data

US 2016/0225456 A1   Aug. 4, 2016

(30) Foreign Application Priority Data

Feb. 2, 2015  (TW) .............................. 104103385 A

(51) Int. Cl.
| G11C 16/10 | (2006.01) |
| G11C 16/20 | (2006.01) |
| G11C 16/26 | (2006.01) |
| G11C 16/16 | (2006.01) |

(52) U.S. Cl.
CPC .............. *G11C 16/20* (2013.01); *G11C 16/16* (2013.01); *G11C 16/26* (2013.01)

(58) Field of Classification Search
USPC .......................... 365/185.12, 189.04, 189.14
See application file for complete search history.

(56) References Cited

U.S. PATENT DOCUMENTS

| 6,519,180 | B2 * | 2/2003 | Tran ..................... G11C 11/5621 365/185.03 |
| 2012/0047404 | A1 | 2/2012 | Peng |
| 2014/0022846 | A1 * | 1/2014 | Kim ........................ G11C 16/16 365/185.12 |
| 2015/0043280 | A1 * | 2/2015 | Pao ....................... G11C 16/225 365/185.18 |

FOREIGN PATENT DOCUMENTS

| TW | 201342051 A | 10/2013 |
| TW | 201407614 A | 2/2014 |
| TW | I433157 B | 4/2014 |
| TW | I469148 B | 1/2015 |

OTHER PUBLICATIONS

Office Action of corresponding TW application, published on May 24, 2016.

* cited by examiner

*Primary Examiner* — Huan Hoang
*Assistant Examiner* — Minh Dinh
(74) *Attorney, Agent, or Firm* — Wang Law Firm, Inc.

(57) ABSTRACT

A data storage device includes a flash memory, a voltage source and a controller. The flash memory includes a plurality of blocks, wherein each of the blocks includes a plurality of pages. The voltage source provides the flash memory with an operation voltage. The controller determines whether the operation voltage was lower than a predetermined voltage level during a predetermined operation after the predetermined operation on the flash memory is finished, and enabling the flash memory to initialize when the operation voltage was lower than the predetermined voltage level during the predetermined operation.

24 Claims, 6 Drawing Sheets

DATA STORAGE DEVICE AND DATA MAINTENANCE METHOD

CROSS REFERENCE TO RELATED APPLICATIONS

This Application claims priority of Taiwan Patent Application No. 104103385, filed on Feb. 2, 2015, the entirety of which is incorporated by reference herein.

BACKGROUND OF THE INVENTION

1. Field of the Invention

The present invention relates to a data-storage device, and in particular to a data-storage device capable of initializing itself according to the operation voltage.

2. Description of the Related Art

Flash memory is considered a non-volatile data-storage device, using electrical methods to erase and program itself. NAND Flash, for example, is often used in memory cards, USB flash devices, solid state devices, eMMCs, and other memory devices.

Flash memory such as NAND Flash uses a multiple-block structure to store data, wherein the flash memory uses floating gate transistors. The floating gates of the floating gate transistor may catch electronic charges for storing data. However, the floating gates may lose their electronic charges due to various operations and the various environmental parameters of the flash memory, which can lead to read and write errors. Moreover, unstable power can also lead to read and write errors.

BRIEF SUMMARY OF THE INVENTION

A detailed description is given in the following embodiments with reference to the accompanying drawings.

The present invention provides a data storage device. The data storage device includes a flash memory, a voltage source and a controller. The flash memory includes a plurality of blocks, wherein each of the blocks includes a plurality of pages. The voltage source provides the flash memory with an operation voltage. The controller determines whether the operation voltage was lower than a predetermined voltage level during a predetermined operation after the predetermined operation on the flash memory is finished, and enabling the flash memory to initialize when the operation voltage was lower than the predetermined voltage level during the predetermined operation.

The present invention further provides a data maintenance method applied to a data storage device of a flash memory, wherein the flash memory includes a plurality of blocks, and each of the blocks comprises a plurality of pages. The data maintenance method includes: determining whether an operation voltage was lower than a predetermined voltage level during a predetermined operation after performing the predetermined operation on the flash memory; and enabling the flash memory to initialize when the operation voltage was lower than the predetermined voltage level during the predetermined operation.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
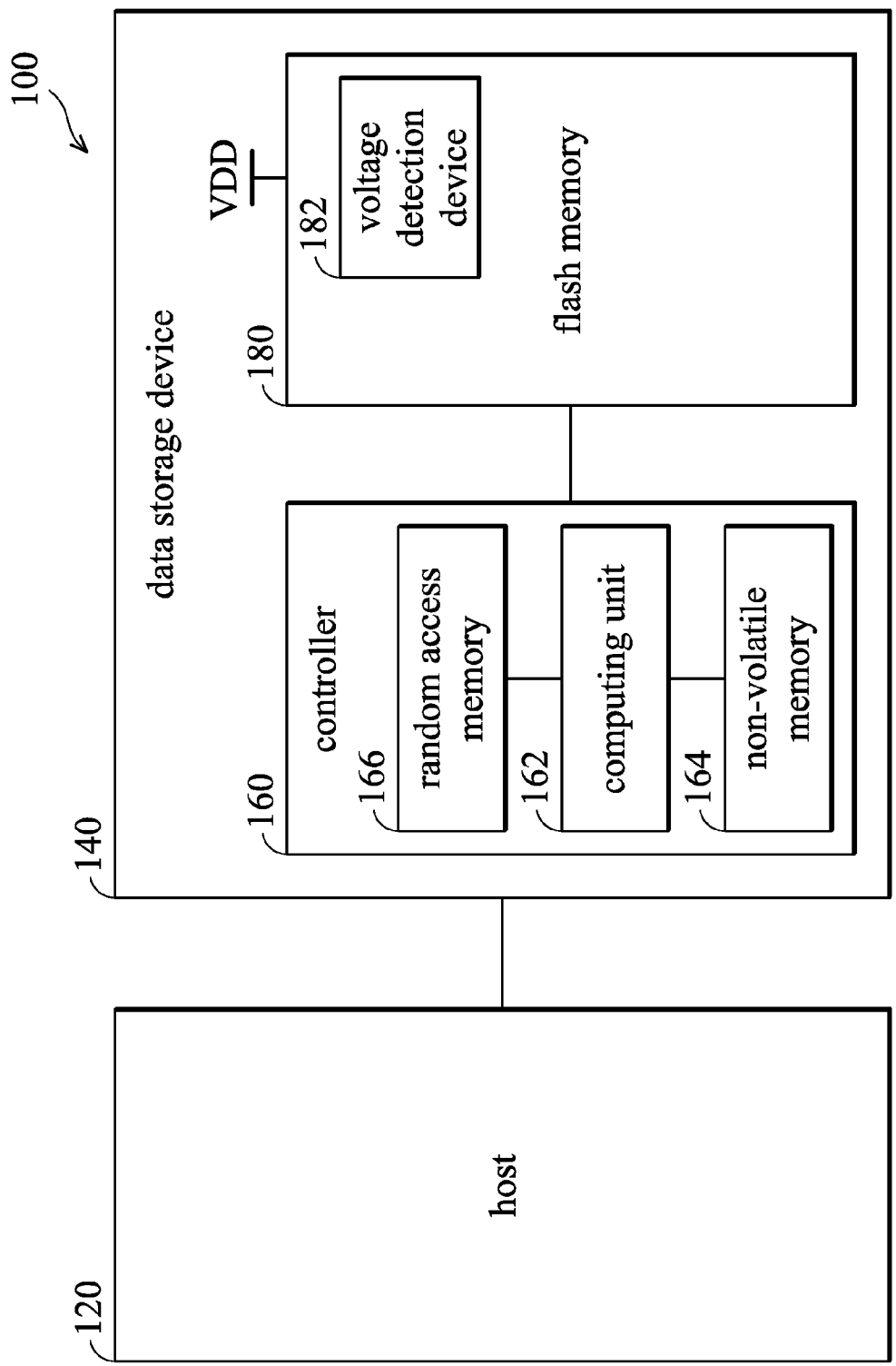
FIG. 1 is a schematic diagram illustrating an embodiment of an electronic system of the present invention.

FIG. 1 is a schematic diagram illustrating an embodiment of an electronic system of the present invention. The electronic system 100 includes a host 120 and a data storage device 140. It should be noted that the data storage device 140 is an embedded multimedia card (eMMC), but it is not limited thereto. The data storage device 140 includes a flash memory 180, a controller 160, a voltage source VDD and a voltage detection device 182. The controller device 160 includes a computing unit 162, a random access memory 166 (RAM) and a non-volatile memory, such as read only memory 164 (ROM). The non-volatile memory 164, the program code stored in the non-volatile memory 164 and data stored in the non-volatile memory 164 constitute firmware executed by the processing unit 162, and the controller 160 is configured to control the flash memory 180 based on the firmware. The flash memory 180 includes a plurality of pages. In one embodiment, the flash memory 180 includes a plurality of blocks, and each of the blocks includes a plurality of pages, wherein the flash memory 180 erases data by units of blocks, and is only able to access the data by units of pages, and writes data by units of pages. The voltage source VDD is provided to the flash memory 180 to be the operation voltage of the flash memory 180, and the flash memory 180 can work by the provided operation voltage. It should be noted that the voltage source VDD can be implemented in the controller 160. Namely, the operation voltage of the flash memory 180 is provided by the controller 160, but it is not limited thereto. In another embodiment, the voltage source VDD is implemented outside of the controller 160. For example, the voltage source VDD can be implemented in a voltage source circuit (not shown) of the data storage device 140. The voltage detection device 182 detects whether the operation voltage provided by the voltage source VDD to the flash memory 180 is lower than a predetermined voltage level, and writes a predetermined value into a flag when the operation voltage is lower than the predetermined voltage level. For example, the flag can be implemented in the random access memory of the controller 160, or the flag can be implemented in at least one specific page of the flash memory, but it is not limited thereto.

It should be noted that, in this embodiment, the voltage detection device 182 is implemented inside of the flash memory 180, but it is not limited thereto. In another embodiment, the voltage detection device 182 can be implemented outside of the flash memory 180. When the voltage detection device 182 is implemented inside of the flash memory 180, the voltage detection device 182 can directly detect the operation voltage received by the flash memory 180, and directly detect whether the operation voltage is lower than the predetermined voltage level. When the voltage detection device 182 is implemented outside of the flash memory 180, the voltage detection device 182 can detect the operation voltage applied to the flash memory 180 from outside to detect whether the operation voltage is lower than a predetermined voltage level. In this embodiment, the voltage detection device 182 can detect whether the operation voltage is lower than the predetermined voltage level by itself, wherein when the operation voltage is lower than the predetermined voltage level, the voltage detection device 182 transmits an enable command to the controller 160, so that the controller 160 writes the predetermined value into the flag implemented in the random access memory 160 in response to the enable command or the voltage detection device 182 can directly write the predetermined value into the flag implemented in the flash memory 180. In another embodiment, the voltage detection device 182 transmits the value of the detected operation voltage to the controller 160, and the controller 160 determines whether the operation voltage is lower than the predetermined voltage level according to the value of the operation voltage detected by the voltage detection device 182, wherein when the operation voltage is lower than the predetermined voltage level, the controller 160 writes the predetermined value into the flag implemented in the random access memory 160 or the controller 160 enables the flash memory 180 to write the predetermined value into the flag implemented in the flash memory 180.

Moreover, the controller 160 is further configured to determine whether the operation voltage was lower than the predetermined voltage level during a predetermined operation according to the value of the flag after the predetermined operation is performed and finished. Furthermore, the controller 160 enables the flash memory 180 to initialize when the operation voltage was lower than the predetermined voltage level during the predetermined operation. It should be noted that the controller 160 is further configured to erase (reset) the flag when an enable command which is arranged to enable the predetermined operation is transmitted to the flash memory 180, and read the flag to determine whether the operation voltage was lower than the predetermined voltage level after the predetermined operation is finished.

In one embodiment, the predetermined operation is an erase operation arranged to erase a first block of the blocks of flash memory 180. The controller 160 pushes back the first block to select a second block from the blocks of the flash memory 180 for performing the erase operation after the flash memory 180 is initialized. The controller 160 transmits an erase confirmation command to the flash memory 180 to confirm whether the erase operation was successful when the operation voltage was not lower than the predetermined voltage level, and makes the first block as a bad block when the erase operation fails. For example, when the controller 160 is required to erase a block, the controller 160 selects a first block from a spare pool. After the controller 160 finishes performing the erase operation on the first block of the flash memory 180, the controller 160 determines whether the operation voltage was lower than the predetermined voltage level during the erase operation according to the value of the flag. When the operation voltage was lower than the predetermined voltage level during the erase operation, the controller 160 enables the flash memory 180 to initialize. After the flash memory 180 is finished initializing, the controller 160 pushes back the first block to the spare pool, and select a second block which is not the first block from the spare pool to perform the erase operation. When the operation voltage was not lower than the predetermined voltage level during the erase operation, the controller 160 transmits an erase confirmation command to the flash memory 180 to confirm whether the erase operation is a success. When the controller 160 confirms that the first block has failed to be erased, the controller 160 marks the first block as a bad block.

In another embodiment, the predetermined operation is a write operation arranged to write data into a first page of a first block of the flash memory 180. The controller 160 moves the data of the first block to a second block of the flash memory 180 after the flash memory 180 is initialized, wherein the second block is not the first block. The controller 160 is further configured to transmit a written confirmation command to the flash memory 180 to confirm whether the write operation was successful when the operation voltage was not lower than the predetermined voltage level, wherein the controller 160 is further configured to mark the first block as a bad block and move the data of the first block to a second block when the write operation fails, wherein the second block is not the first block. For example, when the controller 160 finishes performing the write operation on the first page of the first block, the controller 160 determines whether the operation voltage was lower than the predetermined voltage level during the write operation of the first block according to the value of the flag. When the operation voltage was lower than the predetermined voltage level during the erase operation, the controller 160 enables the flash memory 180 to initialize. After the flash memory 180 is finished initializing, the controller 160 moves the data of the first block to a second block, wherein the second block is not the first block. When the operation voltage was not lower than the predetermined voltage level during the write operation, the controller 160 transmits a written confirmation command to the flash memory 180 to confirm whether the write operation is a success, wherein the controller 160 marks the first block as a bad block (Mark Bad) and moves the data of the first block to a second block when the write operation fails, wherein the second block is not the first block.

In another embodiment, the predetermined operation is a read operation arranged to read a first page of a first block. It should be noted that the controller 160 is configured to perform the step of determining whether the operation voltage was lower than the predetermined voltage level during the predetermined operation (read operation) after the read operation fails to read the first page. The controller 160 is further configured to read the first page again after the flash memory 180 is initialized. When the operation voltage was not lower than the predetermined voltage level, the controller 160 increases a read failure count of the first page by one. For example, when the controller 160 reads a first page and the error bits of the first page is too high to be corrected, the controller 160 determines whether the operation voltage was lower than the predetermined voltage level during the read operation. When the operation voltage was lower than the predetermined voltage level during the read operation, the controller 160 enables the flash memory 180 to initialize. After the flash memory 180 is finished initializing, the controller 160 reads the first page again. When the operation voltage was not lower than the predetermined voltage level during the read operation, the controller 160 increases the read failure count (UECC Count) of the first page by one.

Moreover, in one embodiment, the operation voltage of the flash memory 180 is different from the operation voltage of the controller 160, and the operation voltage of the flash memory 180 is higher than the operation voltage of the controller 160, but it is not limited thereto. In one embodiment, the controller 160 is able to detect the operation voltage. However, the controller 160 can only detect the operation voltage applied to the controller 160. When the value of the operation voltage applied on the flash memory 180 is between the value of the ideal operation voltage of the flash memory 180 and the ideal operation voltage of the controller 160, the controller 160 cannot realize that the operation voltage applied on the flash memory 180 is abnormal. Therefore, the flash memory 180 still needs the voltage detection device 182 to detect whether the operation voltage of the flash memory 180 is lower than the predetermined voltage level.

Figure 2:
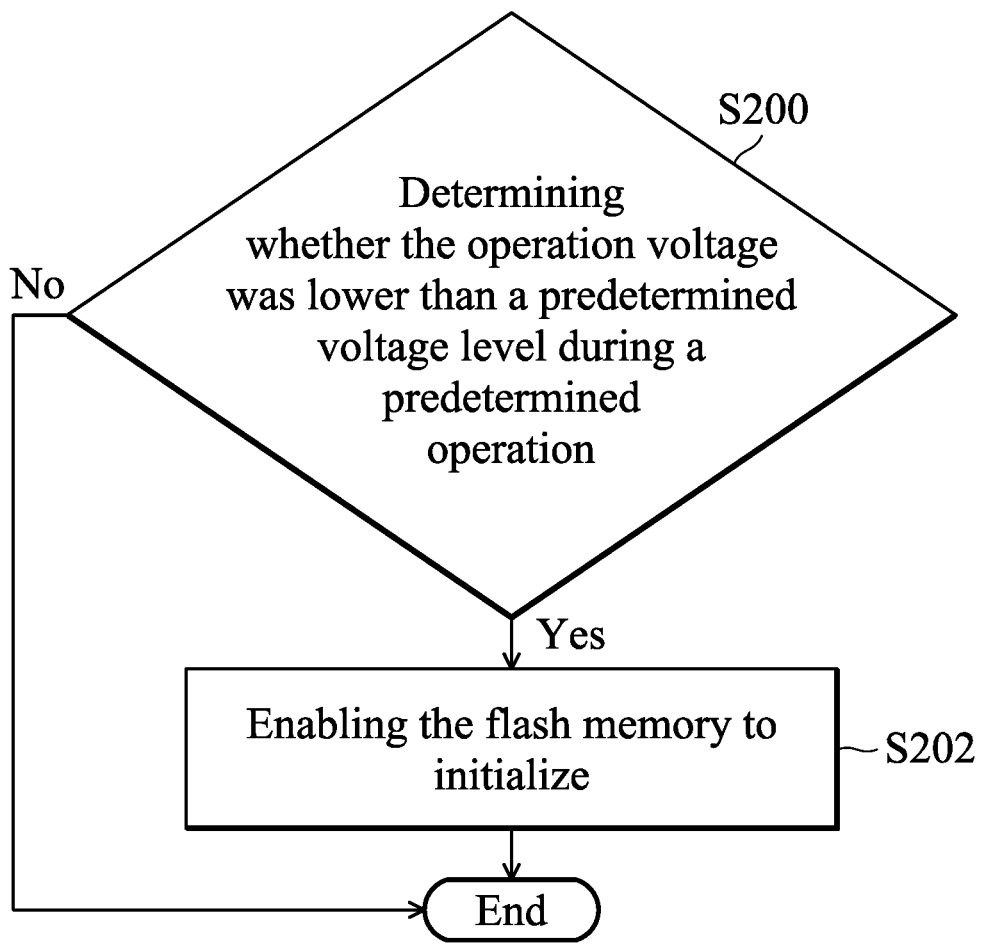
FIG. 2 is a flowchart of a data maintenance method according to an embodiment of the present invention.

FIG. 2 is a flowchart of a data maintenance method according to an embodiment of the present invention. The data maintenance method is applied to the data storage device 140 of FIG. 1. The process starts at step S200.

In step S200, the controller 160 determines whether the operation voltage was lower than a predetermined voltage level during a predetermined operation after the predetermined operation is finished performing on the flash memory 180. When the operation voltage was lower than he predetermined voltage level during the predetermined operation, the process goes to step S202, otherwise, the process ends at step S200.

Next, in step S202, the controller 160 enables the flash memory 180 to initialize. For example, the controller 160 can transmit an initial command to the flash memory 180, and the flash memory 180 starts to initialize in response to the initial command, wherein the flash memory 180 can adjust the status of the flash memory 180 during the initialization, so that the flash memory 180 can recover from bad issues. The process ends at step S202.

Figure 3:
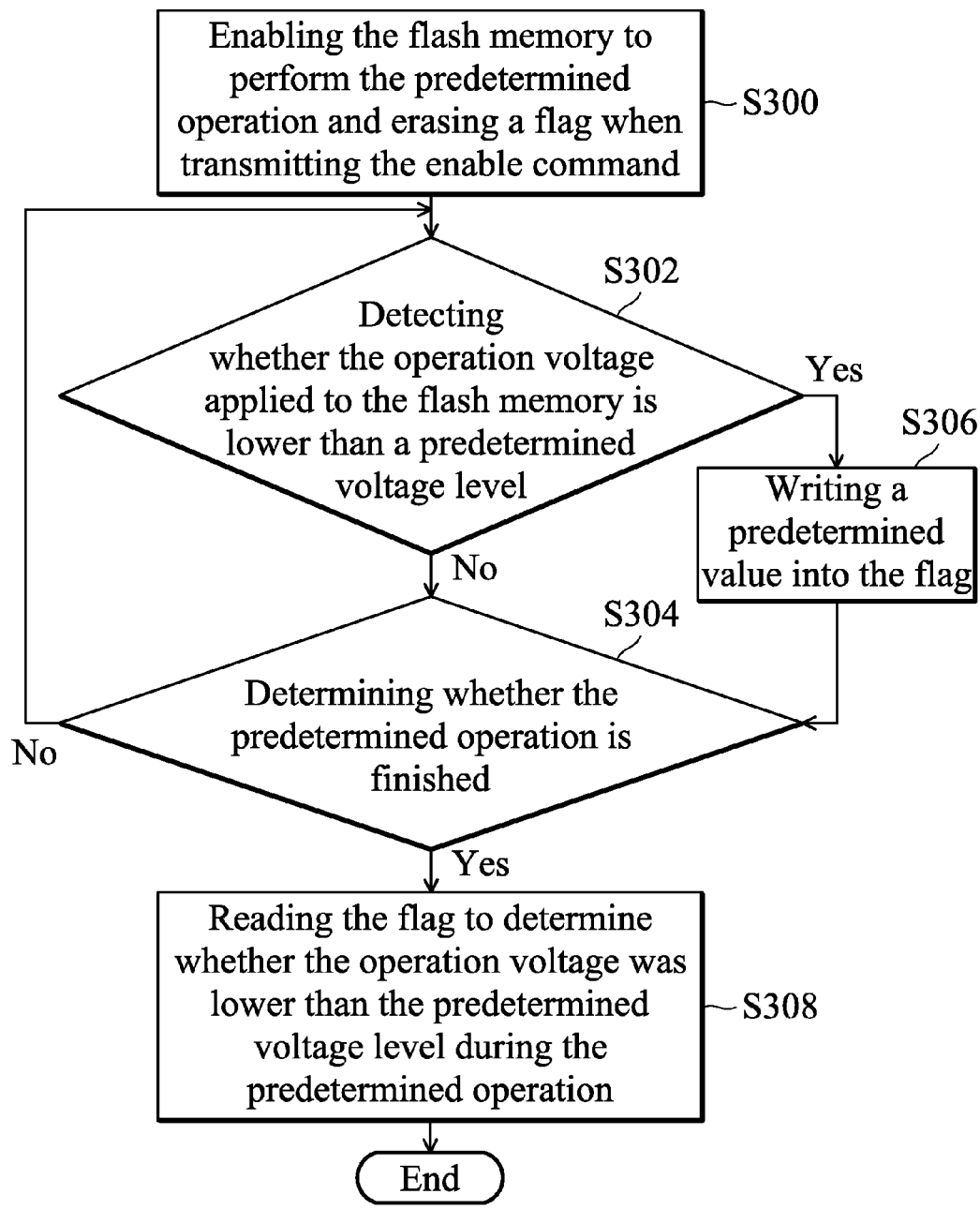
FIG. 3 is a flowchart of a voltage determination method of the data maintenance method according to an embodiment of the present invention.

FIG. 3 is a flowchart of a voltage determination method of the data maintenance method according to an embodiment of the present invention. The voltage determination method is a detailed description of the step S200 of FIG. 2. The determination method is arranged to determine whether the operation voltage was lower than the predetermined voltage level during the predetermined operation. The process starts at step S300.

In step S300, the controller 160 transmits an enable command which is arranged to enable the flash memory 180 to perform the predetermined operation to the flash memory 180 to enable the predetermined operation, and erases a flag when transmitting the enable command. For example, the controller 160 resets the flag to zero when the controller 160 is transmitting the enable command which is arranged to enable the predetermined operation to the flash memory 180, but it is not limited thereto. In other embodiments, the value of the erased flag can be other values.

Next, in step S302, the voltage detection device 182 detects whether the operation voltage applied to the flash memory 180 by the voltage source VDD is lower than a predetermined voltage level. It should be noted that, in the embodiment of FIG. 1, the voltage detection device 182 is implemented inside of the flash memory 180, but it is not limited thereto. In other embodiments, the voltage detection device 182 is implemented outside of the flash memory 180. When the voltage detection device 182 is implemented inside of the flash memory 180, the voltage detection device 182 can directly detect the operation voltage received by the flash memory 180, and directly detect whether the operation voltage is lower than the predetermined voltage level. When the voltage detection device 182 is implemented outside of the flash memory 180, the voltage detection device 182 can detect the operation voltage applied to the flash memory 180 from outside to detect whether the operation voltage is lower than a predetermined voltage level. When the operation voltage is lower than the predetermined voltage level, the process goes to step S306. When the operation voltage is not lower than the predetermined voltage level, the process goes to step S304.

In step S304, the controller 160 determines whether the predetermined operation is finished. When the predetermined operation is finished, the process goes to step S308, otherwise, the process back to step S302, the voltage detection device 182 continues to detect whether the operation voltage applied to the flash memory 180 by the voltage source VDD is lower than the predetermined voltage level. To be more specific, the controller 160 can determine whether the predetermined operation is finished by the signals returned by the flash memory 180.

Next, in step S306, the voltage detection device 182 writes a predetermined value into the flag. For example, the voltage detection device 182 can write "1" into the flag, but it is not limited thereto. In other embodiments, the predetermined value can be other values.

Next, in step S308, the controller 160 reads the flag to determine whether the operation voltage was lower than the predetermined voltage level during the predetermined operation. To be more specific, when the value read by the controller 160 from the flag is same as the predetermined value, the controller 160 determines that the operation voltage was lower than the predetermined voltage level during the predetermined operation. When the value read by the controller 160 from the flag is same as the value of the erased flag, the controller 160 determines that the operation voltage was not lower than the predetermined voltage level during the predetermined operation. The process ends at step S308.

Figure 4:
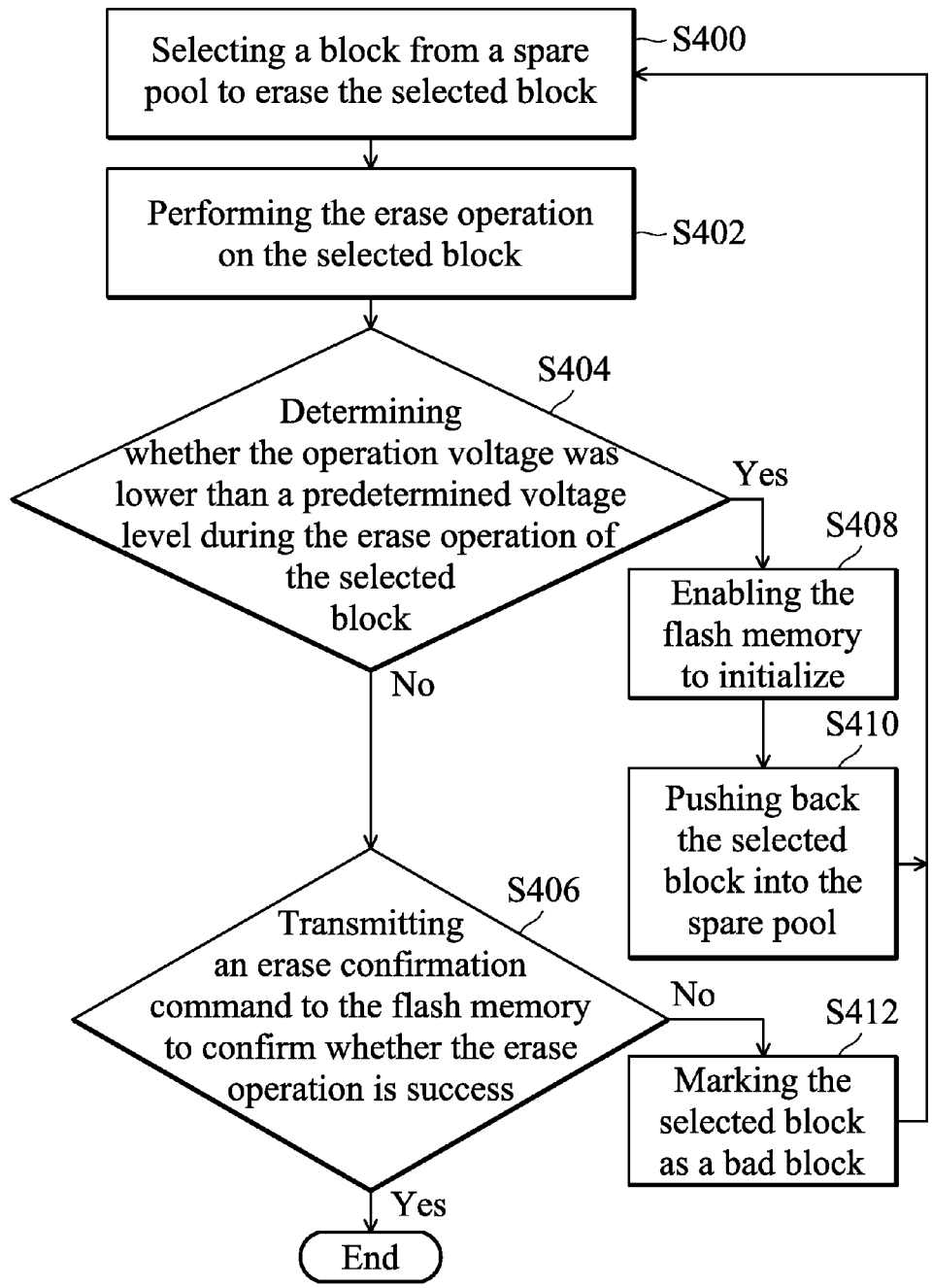
FIG. 4 is a flowchart of a data maintenance method according to another embodiment of the present invention.

FIG. 4 is a flowchart of a data maintenance method according to another embodiment of the present invention. The data maintenance method is applied to the data storage device 140 of FIG. 1. It should be noted that, in this embodiment, the predetermined operation is an erase operation arranged to erase a block. The process starts at step S400.

In step S400, the controller 160 selects a block from a spare pool to erase the selected block. For example, when the controller 160 is required to erase a block, the controller 160 can select a first block from the spare pool.

Next, in step S402, the controller 160 performs the erase operation on the selected block. For example, when the controller 160 selects the first block from the spare pool in step S400, the controller 160 erases the first block in step S402.

Next, in step S404, the controller 160 determines whether the operation voltage was lower than a predetermined voltage level during the erase operation of the selected block. When the operation voltage was lower than the predetermined voltage level during the erase operation, the process goes to step S408, otherwise, the process goes to step S416. To be more specific, the controller 160 can determine whether the erase operation is finished according to the signals returned by the flash memory 180, and read the flag to determine whether the operation voltage was lower than the predetermined voltage level during the erase operation when the erase operation is finished.

In step S406, the controller 160 transmits an erase confirmation command to the flash memory 180 to confirm whether the erase operation is a success. When the erase operation is a success, the process ends at step S406, otherwise, the process goes to step S412.

In step S408, the controller 160 enables the flash memory 180 to initialize. For example, the controller 160 can transmit an initial command to the flash memory 180, and the flash memory 180 starts to initialize in response to the initial command.

Next, in step S410, the controller 160 pushes back the selected block into the spare pool. For example, when the first block is selected in step S400 and the operation voltage was lower than the predetermined voltage level during erasing the first block in step S402, the controller 160 pushes back the first block into the spare pool after the flash memory 180 is initialized. Next, the process back to step S400, the controller 160 re-selects a block to erase from the spare pool.

In step S412, the controller 160 marks the selected block as a bad block (Mark Bad). Next, the process back to step S400, the controller 160 re-selects a block to erase from the spare pool.

Figure 5:
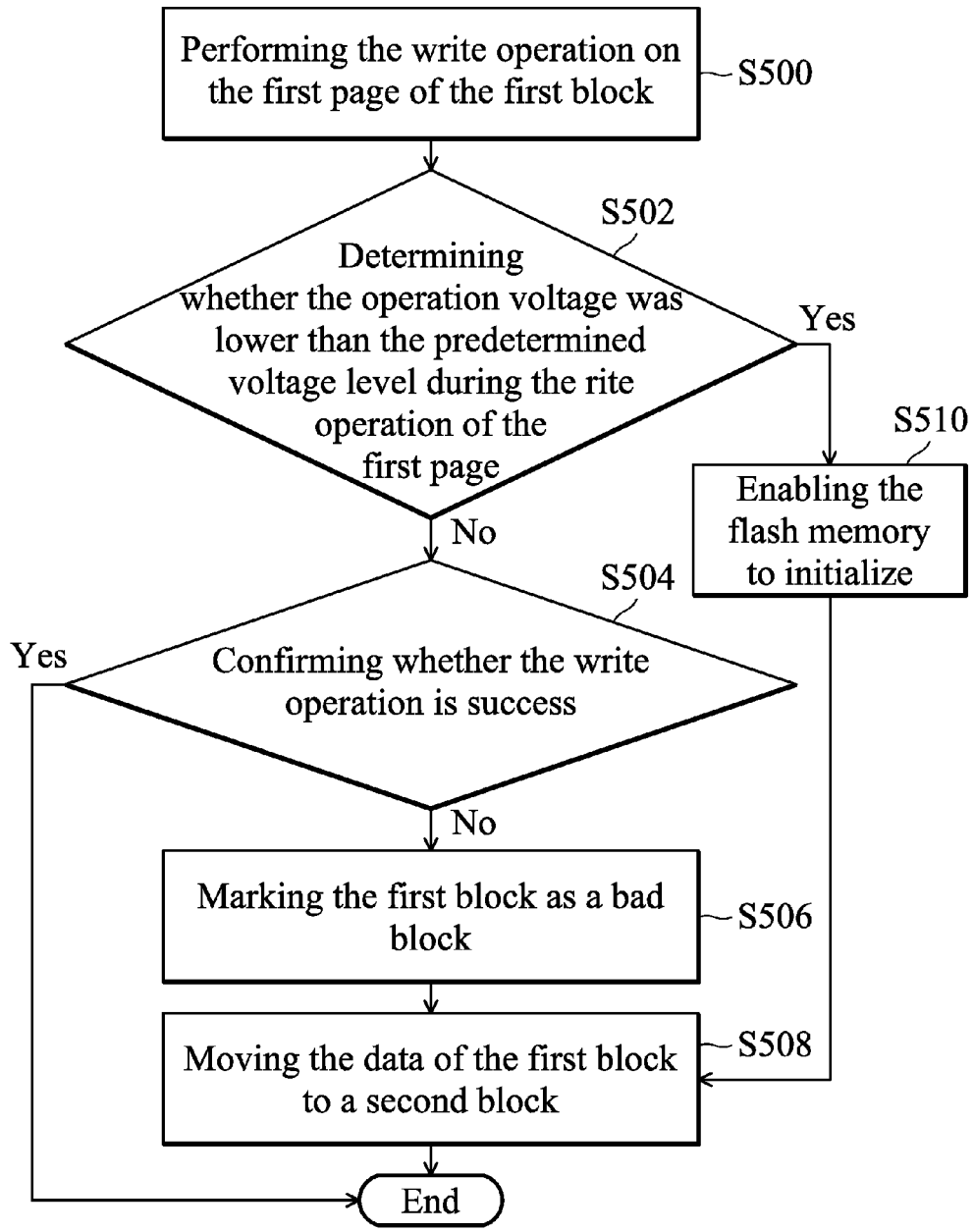
FIG. 5 is a flowchart of a data maintenance method according to another embodiment of the present invention.

FIG. 5 is a flowchart of a data maintenance method according to another embodiment of the present invention. The data maintenance method is applied to the data storage device 140 of FIG. 1. It should be noted that in this embodiment, the predetermined operation is a write operation arranged to write data into a first page of a first block. The process starts at step S500.

In step S500, the controller 160 performs the write operation on the first page of the first block.

Next, in step S502, the controller 160 determines whether the operation voltage was lower than the predetermined voltage level during the rite operation of the first page. When the operation voltage was lower than the predetermined voltage level during the write operation, the process goes to step S510, otherwise, the process goes to step S504. To be more specific, the controller 160 determines whether the write operation is finished according to the signals returned by the flash memory 180. When the write operation is finished, the controller 160 reads the flag to determine whether the operation voltage was lower than the predetermined voltage level during the write operation of the first page.

In step S504, the controller 160 transmits a written confirmation command to the flash memory 180 to confirm whether the write operation is a success. When the write operation is a success, the process ends at step S504, otherwise, the process goes to step S506.

In step S506, the controller 160 marks the first block as a bad block (Mark Bad).

Next, in step S508, the controller 160 moves the data of the first block to a second block, wherein the second block is not the first block. The process ends at step S508.

In step S510, the controller 160 enables the flash memory 180 to initialize. For example, the controller 160 can transmit an initial command to the flash memory 180, and the flash memory 180 starts to initialize in response to the initial command. Next, the process goes to step S508, the controller 160 moves the data of the first block to a second block, wherein the second block is not the first block.

Figure 6:
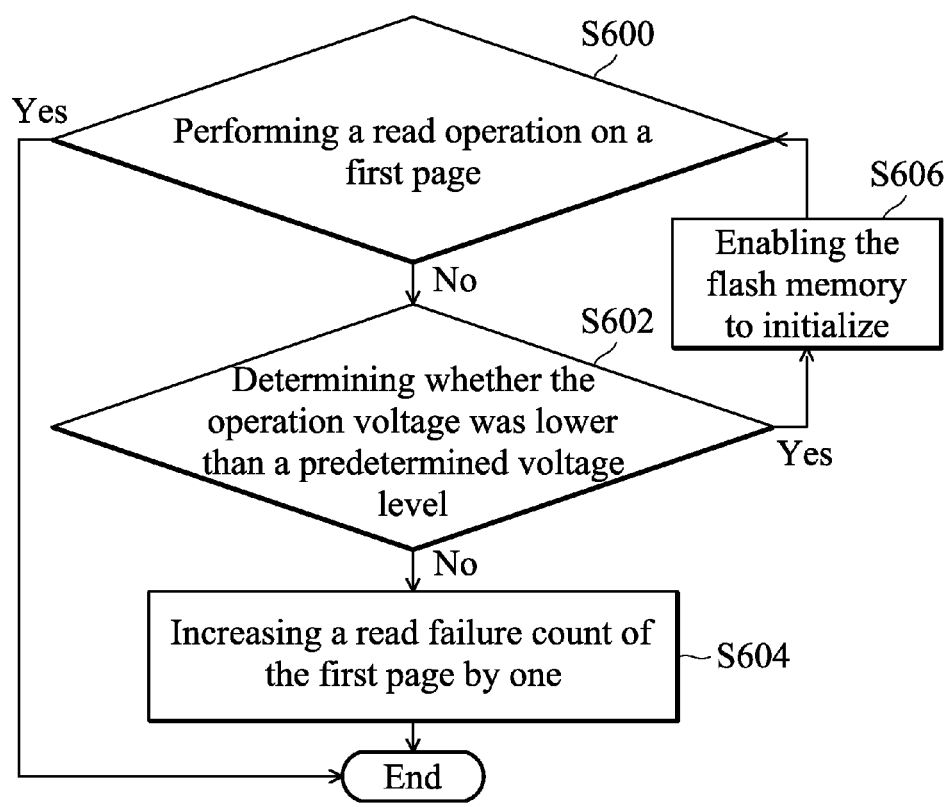
FIG. 6 is a flowchart of a data maintenance method according to another embodiment of the present invention.

FIG. 6 is a flowchart of a data maintenance method according to another embodiment of the present invention. The data maintenance method is applied to the data storage device 140 of FIG. 1. It should be noted that, in this embodiment, the predetermined operation is a read operation arranged to read a first page of a first block. The process starts at step S600.

In step S600, the controller 160 performs a read operation on a first page. When the first page is successfully read, the process ends at step S600. When the first page cannot be successfully read, the process goes to step S602. To be more specific, when the error bits of the first page is too high, and the controller 160 cannot correct the error bits of the first page, the process goes to step S602.

Next, in step S602, the controller 160 determines whether the operation voltage was lower than a predetermined voltage level according to the value of the flag. When the operation voltage was lower than the predetermined voltage level during the erase operation, the process goes to step S606, otherwise, the process goes to step S604. To be more specific, the controller 160 can determine whether the read operation is finished according to the signals returned by the flash memory 180, and read the flag to determine whether the operation voltage was lower than the predetermined voltage level when the read operation is finished.

In step S604, the controller 160 is configured to increase a read failure count (UECC Count) of the first page by one. The process ends at step S604.

In step S606, the controller 160 enables the flash memory 180 to initialize. For example, the controller 160 can transmit an initial command to the flash memory 180, and the flash memory 180 starts to initialize in response to the initial command. Next, the process returns to step S600, the controller 160 read the first page again.

The data storage device and the data maintenance method of the present invention can enable the flash memory to initialize according to the operation voltage.

Data transmission methods, or certain aspects or portions thereof, may take the form of program code (i.e., executable instructions) embodied in tangible media, such as floppy diskettes, CD-ROMS, hard drives, or any other machine-readable storage medium, wherein, when the program code is loaded into and executed by a machine such as a computer, the machine thereby becomes an apparatus for practicing the methods. The methods may also be embodied in the form of program code transmitted over some transmission medium, such as electrical wiring or cabling, through fiber optics, or via any other form of transmission, wherein, when the program code is received and loaded into and executed by a machine such as a computer, the machine becomes an apparatus for practicing the disclosed methods. When implemented on a general-purpose processor, the program code combines with the processor to provide a unique apparatus that operates analogously to application-specific logic circuits.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A data storage device, comprising:
   a flash memory, comprising a plurality of blocks, wherein each of the blocks comprises a plurality of pages;
   a voltage source, providing the flash memory an operation voltage; and a controller, determining whether the operation voltage was lower than a predetermined voltage level during a predetermined operation after the predetermined operation on the flash memory is finished, and enabling the flash memory to initialize when the operation voltage was lower than the predetermined voltage level during the predetermined operation.

2. The data storage device as claimed in claim 1, wherein the flash memory further comprises a voltage detection device, wherein the voltage detection device detects whether the operation voltage is lower than the predetermined voltage level, and writes a predetermined value into a flag when the operation voltage is lower than the predetermined voltage level.

3. The data storage device as claimed in claim 2, wherein the controller further erases the flag when transmitting an enable command to the flash memory for enabling the predetermined operation, and reads the flag to determine whether the operation voltage was lower than the predetermined voltage level during the predetermined operation when the predetermined operation is finished.

4. The data storage device as claimed in claim 1, wherein the predetermined operation is an erase operation used for erasing a first block of the blocks.

5. The data storage device as claimed in claim 4, wherein the controller pushes back the first block to select a second block to be performed by the erase operation when the flash memory is initialized, wherein the second block is not the first block.

6. The data storage device as claimed in claim 4, wherein the controller transmits an erase confirmation command to the flash memory to confirm whether the erase operation was successful when the operation voltage was not lower than the predetermined voltage level, and marks the first block as a bad block when the erase operation fails.

7. The data storage device as claimed in claim 1, wherein the predetermined operation is a write operation used to write data into a first page of a first block of the blocks.

8. The data storage device as claimed in claim 7, wherein the controller moves the data of the first block to a second block of the blocks after the flash memory is initialized, wherein the second block is not the first block.

9. The data storage device as claimed in claim 7, wherein the controller transmits a written confirmation command to the flash memory to confirm whether the write operation was successful when the operation voltage was not lower than the predetermined voltage level, wherein the controller marks the first block as a bad block and moves the data of the first block to a second block when the erase operation fails, wherein the second block is not the first block.

10. The data storage device as claimed in claim 1, wherein the predetermined operation is a read operation used to read a first page of a first block of the blocks, wherein the controller performs the step of determining whether the operation voltage was lower than the predetermined voltage level after the read operation fails to read the first page.

11. The data storage device as claimed in claim 10, wherein the controller reads the first page again after the flash memory is initialized.

12. The data storage device as claimed in claim 10, wherein the controller increases a read failure count corresponding to the first page by one when the operation voltage was not lower than the predetermined voltage level.

13. A data maintenance method, applied to a data storage device of a flash memory, wherein the flash memory comprises a plurality of blocks, and each of the blocks comprises a plurality of pages, the data maintenance method comprising:

determining whether an operation voltage was lower than a predetermined voltage level during a predetermined operation after performing the predetermined operation on the flash memory; and enabling the flash memory to initialize when the operation voltage was lower than the predetermined voltage level during the predetermined operation.

14. The data maintenance method as claimed in claim 13, further comprising:

detecting whether the operation voltage is lower than the predetermined voltage level; and writing a predetermined value into a flag when the operation voltage is lower than the predetermined voltage level.

15. The data maintenance method as claimed in claim 14, further comprising erasing the flag when transmitting an enable command to the flash memory for enabling the predetermined operation, wherein the step of determining whether the operation voltage was lower than the predetermined voltage level during the predetermined operation further comprises reading the flag to determine whether the operation voltage was lower than the predetermined voltage level during the predetermined operation when the predetermined operation is finished.

16. The data maintenance method as claimed in claim 13, wherein the predetermined operation is an erase operation used for erasing a first block of the blocks.

17. The data maintenance method as claimed in claim 16, further comprising pushing back the first block to select a second block to be performed by the erase operation when the flash memory is initialized, wherein the second block is not the first block.

18. The data maintenance method as claimed in claim 16, further comprising:

transmitting an erase confirmation command to the flash memory to confirm whether the erase operation was successful when the operation voltage was not lower than the predetermined voltage level; and marking the first block as a bad block when the erase operation fails.

19. The data maintenance method as claimed in claim 13, wherein the predetermined operation is a write operation used to write data into a first page of a first block of the blocks.

20. The data maintenance method as claimed in claim 19, further comprising moving the data of the first block to a second block of the blocks after the flash memory is initialized, wherein the second block is not the first block.

21. The data maintenance method as claimed in claim 19, further comprising:

transmitting a written confirmation command to the flash memory to confirm whether the write operation was successful when the operation voltage was not lower than the predetermined voltage level; and marking the first block as a bad block and moving the data of the first block to a second block when the erase operation fails, wherein the second block is not the first block.

22. The data maintenance method as claimed in claim 13, wherein the predetermined operation is a read operation used to read a first page of a first block of the blocks, wherein the step of determining whether the operation voltage was lower than the predetermined voltage level during the predetermined operation is performed after the read operation fails to read the first page.

23. The data maintenance method as claimed in claim 22, further comprising reading the first page again after the flash memory is initialized.

24. The data maintenance method as claimed in claim 22, further comprising increasing a read failure count corresponding to the first page by one when the operation voltage was not lower than the predetermined voltage level.

* * * * *